(12) United States Patent  
Ali et al.

(10) Patent No.: US 6,591,410 B1  
(45) Date of Patent: Jul. 8, 2003

(54) SIX-TO-ONE SIGNAL/POWER RATIO BUMP AND TRACE PATTERN FOR FLIP CHIP DESIGN

(75) Inventors: Anwar Ali, London (GB); Mike Teh-An Liang, Milpitas, CA (US); Bing Yi, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 235 days.

(21) Appl. No.: 09/752,626

(22) Filed: Dec. 28, 2000

(51) Int. Cl.[7] ............................................... G06F 17/50
(52) U.S. Cl. ............................ 716/12; 716/8; 257/786; 257/690; 257/778
(58) Field of Search ................... 716/8–17, 2; 257/786, 257/778, 690; 438/57, 106

(56) References Cited

U.S. PATENT DOCUMENTS

| | | | | |
|---|---|---|---|---|
| 5,818,114 A | * | 10/1998 | Pendse et al. ............... | 257/786 |
| 6,214,638 B1 | * | 4/2001 | Banerjee ...................... | 438/106 |
| 6,225,143 B1 | * | 5/2001 | Rao et al. .................... | 438/106 |
| 6,246,112 B1 | * | 6/2001 | Ball et al. .................... | 257/690 |
| 6,291,898 B1 | * | 9/2001 | Yeh et al. .................... | 257/786 |
| 6,342,406 B1 | * | 1/2002 | Glenn et al. .................. | 438/57 |
| 6,446,250 B1 | * | 9/2002 | Becker ......................... | 716/17 |
| 6,457,157 B1 | * | 9/2002 | Singh et al. .................. | 716/2 |

* cited by examiner

*Primary Examiner*—Vuthe Siek  
(74) *Attorney, Agent, or Firm*—Fitch, Even, Tabin & Flannery

(57) ABSTRACT

A method for making a bump and trace layout for an integrated circuit die includes the step of replicating a routing tile having a first column of I/O pads and a second column of I/O pads wherein the first column is offset from the second column so that the I/O pads of the first column are interleaved between the I/O pads of the second column.

15 Claims, 3 Drawing Sheets

SIX-TO-ONE SIGNAL/POWER RATIO BUMP AND TRACE PATTERN FOR FLIP CHIP DESIGN

BACKGROUND OF THE INVENTION

The present invention relates generally to methods for bump and trace layout for an integrated circuit die. More specifically, but without limitation thereto, the present invention relates to a bump and trace layout for increasing the ratio of signal-to-power connections for a flip chip integrated circuit.

In flip chip packaging technology, the I/O pads, also referred to as "bumps", make electrical contact with pads on a package when the die is turned contact side down, or flipped, and attached to the top surface of the package. A goal of flip chip packaging is to increase the number of I/O devices that can be accommodated on a flip chip using the same minimum I/O pad spacing, or bump pitch. A need therefore exists for a way to accommodate more I/O pads with the same minimum bump pitch.

SUMMARY OF THE INVENTION

The present invention advantageously addresses the needs above as well as other needs by providing a six-to-one signal-to-power ratio bump and trace layout for a flip chip.

In one embodiment, the invention may be characterized as a method that includes the step of replicating a routing tile having a first column of I/O pads and a second column of I/O pads wherein the first column is offset from the second column so that the I/O pads of the first column are interleaved between the I/O pads of the second column.

In another embodiment, the invention may be characterized as an integrated circuit die that includes a routing tile having a first column of I/O pads and a second column of I/O pads wherein the first column is offset from the second column so that the I/O pads of the first column are interleaved between the I/O pads of the second column.

The features and advantages summarized above in addition to other aspects of the present invention will become more apparent from the description, presented in conjunction with the following drawings.

BRIEF DESCRIPTION OF THE DRAWINGS

The above and other aspects, features and advantages of the present invention will be more apparent from the following more specific description thereof, presented in conjunction with the following drawings wherein.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

In a typical flip chip layout, I/O device cells are arranged in a ring around the core device cells. The I/O pads are distributed over the topmost metal layer of the die, which is called the redistribution layer, and connected to corresponding I/O device cells using predefined traces stored in a trace library. The arrangement of the I/O pads and connections is called the bump and trace layout.

Methods for making bump and trace layouts for a flip chip integrated circuit die replicate an I/O pad and trace pattern called a routing tile.

Figures 1, 3:
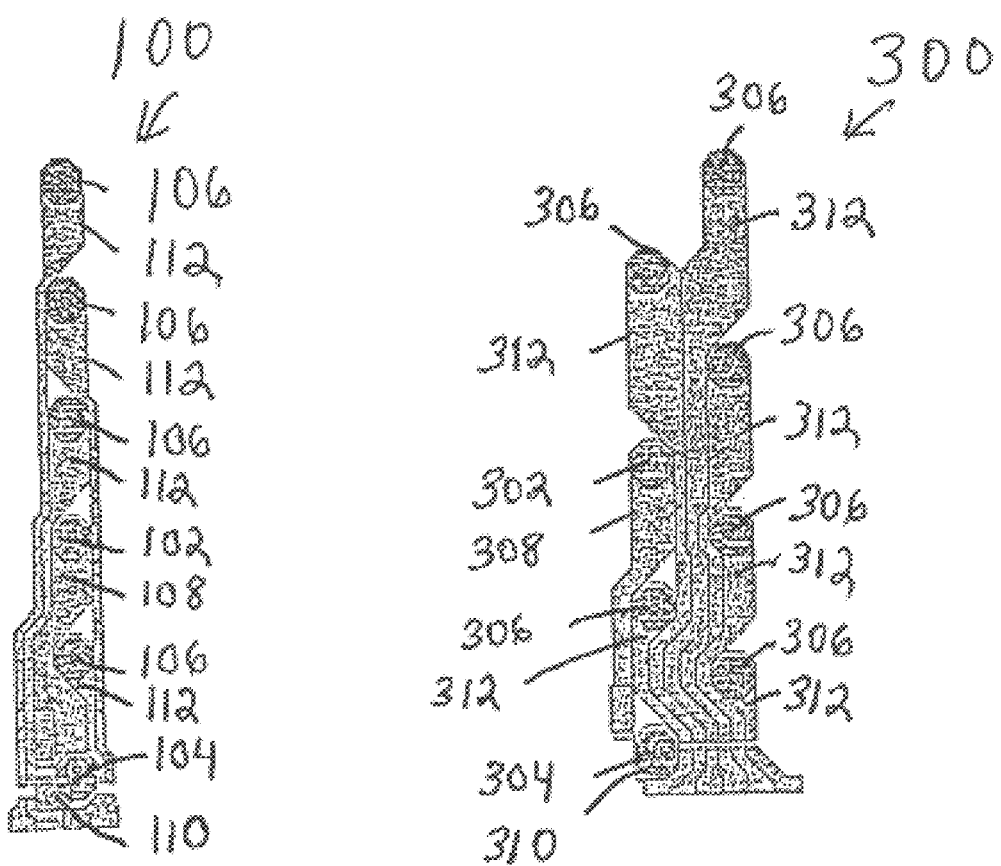
FIG. 1 is a top view diagram illustrating a routing tile of the prior art.
FIG. 3 is a top view diagram illustrating a routing tile for a flip chip according to an embodiment of the present invention.

FIG. 1 is a top view diagram illustrating a routing tile 100 of the prior art. Shown are a power I/O pad 102, a ground I/O pad 104, four signal I/O pads 106, a power trace 108, a ground trace 110, and signal traces 112. The routing tile 100 has a 4:1 signal/power ratio, i.e., there is one power (VDD) I/O pad and one ground (VSS) I/O pad for every four signal I/O pads. The I/O pads are all arranged in a single column, and the traces are routed outside the column. The routing tile 100 may be replicated to produce the bump and trace layout of FIG. 2.

Figure 2:
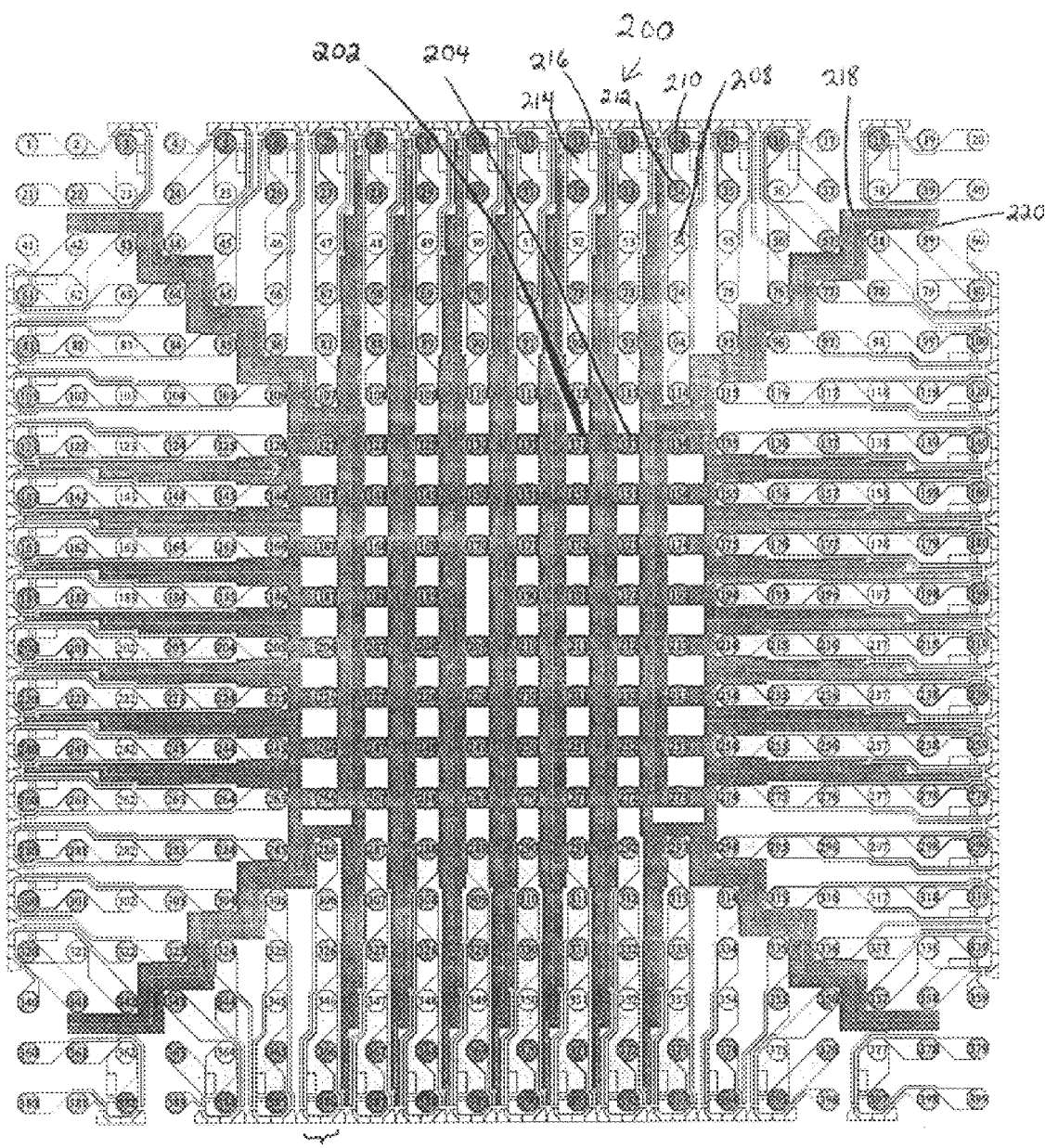
FIG. 2 is a top view diagram illustrating a flip chip bump and trace layout using the routing tile of FIG. 1.

FIG. 2 is a top view diagram illustrating a flip chip bump and trace layout 200 using the routing tile 100 of FIG. 1. Shown are core power I/O pads 202, core ground I/O pads 204, I/O device power I/O pads 208, I/O device ground pads 210, I/O device signal I/O pads 212, power traces 214, ground traces 216, core power buses 218, and core ground buses 220.

In the flip chip bump and trace layout 200, the routing tile 100 is replicated over the entire flip chip I/O device region except the corners. The bumps in the center or core region are core power VDD/VSS bumps 202 and 204. The core power buses 218 and the core ground buses 220 connect the core power VDD/VSS bumps 202 and 204 and extend as far as possible into the I/O device region. The power and ground traces 214 and 216 connect the I/O pads 210 and 212 to the outside edge of the die and may be stored in a trace library for automatic routing.

A disadvantage of the flip chip bump and trace layout 200 is that the number of I/O devices that may be accommodated on a die is limited by the number of available signal I/O pads on the redistribution layer.

FIG. 3 is a top view diagram illustrating a routing tile 300 for a flip chip having a signal/power ratio of 6:1. Shown are a power I/O pad 302, a ground I/O pad 304, six signal I/O pads 306, a power trace 308, a ground trace 310, and signal traces 312.

In contrast to the routing tile 100 described above for FIG. 1 that has a single column of four signal I/O pads 106, the routing tile 300 of FIG. 3 has two columns of three signal I/O pads 306 that are offset so that the I/O pads 306 of the first column are interleaved between the I/O pads 306 of the second column. An advantage of this arrangement is that there are six signal I/O pads 306 for each power I/O pad 304 and ground I/O pad 306 instead of the four signal pads 106 for each power I/O pad 102 and ground I/O pad 104 in FIG. 1. The signal/power ratio is therefore increased from 4:1 to 6:1, i.e., by 50 percent, while the total number of I/O pads is increased from six to eight, i.e., by only 33 percent. Another advantage of the routing tile of FIG. 3 is that there is an additional channel between the columns for routing traces. The extra channel allows the signal traces 312 to be routed between the columns and the power and ground traces 308 and 310 to be routed outside the columns along with core power and ground traces. This arrangement provides greater isolation between signals of neighboring routing tiles. Still another advantage of the routing tile 300 is that wider signal traces 312 may be used in the space between the columns. A further advantage is that the ground traces 310 may be routed underneath the ground I/O pads 304, leaving more space for signal traces. The routing tile 300 may be replicated to produce the bump and trace layout of FIG. 4.

Figure 4:
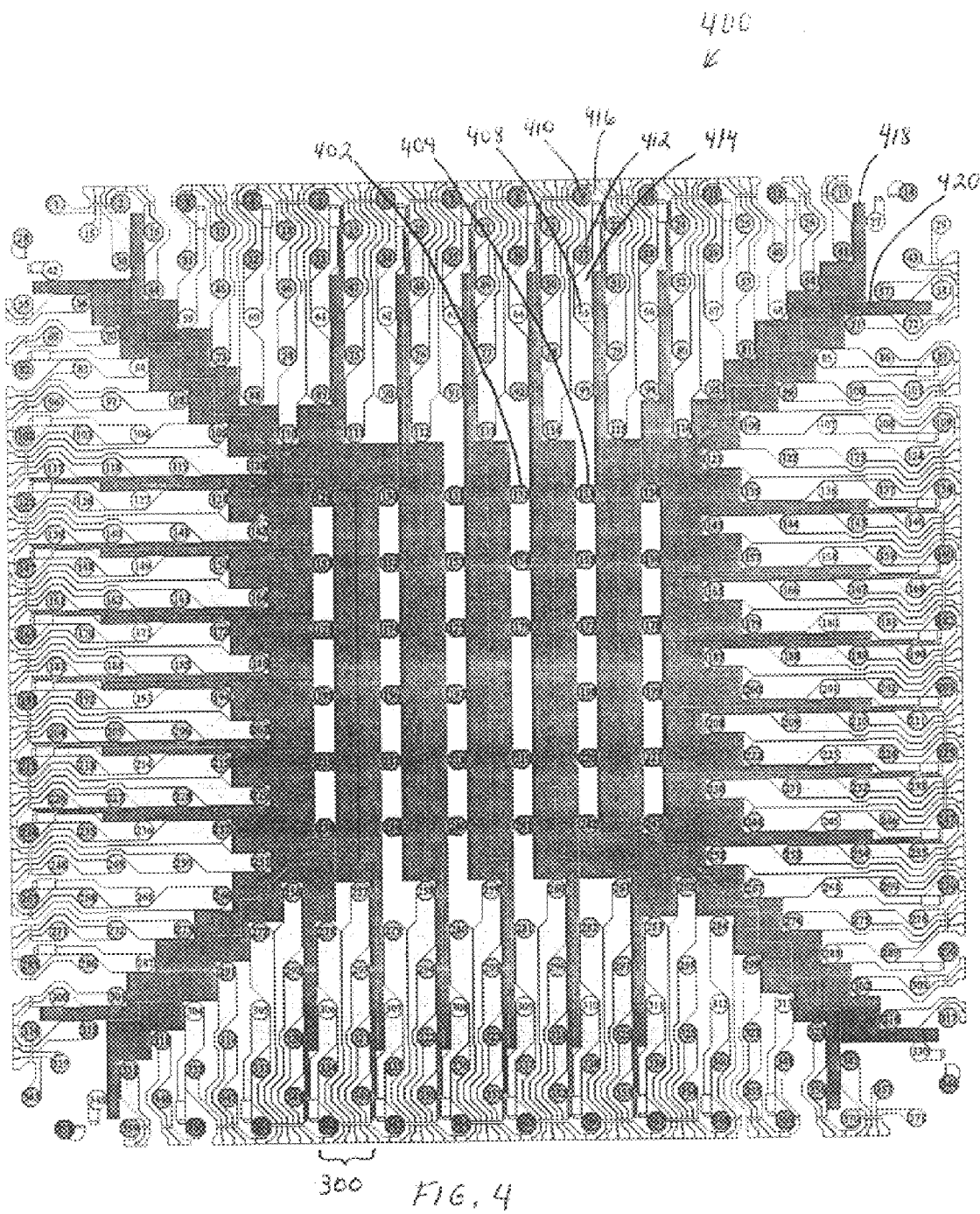
FIG. 4 is a top view diagram illustrating a flip chip bump and trace layout using the routing tile of FIG. 3.

FIG. 4 is a top view diagram illustrating a flip chip bump and trace layout 400 using the routing tile 300 of FIG. 3. Shown are core power I/O pads 402, core ground I/O pads 404, I/O device power I/O pads 408, I/O device ground pads 410, I/O device signal I/O pads 412, power traces 414, ground traces 416, core power buses 418, and core ground buses 420.

In the flip chip bump and trace layout 400, the routing tile 300 is replicated over the entire flip chip I/O device region except the corners. The bumps in the center or core region are core power VDD/VSS bumps 402 and 404. The core power buses 418 and the core ground buses 420 connect the core power VDD/VSS bumps 402 and 404 and extend as far as possible into the I/O device region. The power and ground traces 414 and 416 connect the I/O pads 410 and 412 to the outside edge of the die and may be stored in a trace library for automatic routing.

In this example, the bump pitch is non-uniform, i.e., the spacing between bumps is variable, however the minimum bump pitch is the same as that of FIG. 2. In FIG. 2, the bump pitch is uniform, for example, in a 9-mil package of the prior art, the bump pitch is 9 mil for all bumps. For a 9-mil package made according to the example of FIG. 4, the bump pitch may be greater but not less than 9 mil, thus 9 mil is referred to as the minimum bump pitch. The missing bump in the core region is used to identify the upper left corner of the die for orienting the die in a package. The gaps near the ground I/O pads 304 divide the upper trace from the lower trace. The upper and lower traces are connected during processing by a router. In this example, the bump pitches are carefully defined so that exactly six I/O slots may be aligned with the lower traces and placed between bumps in the outmost bump row/column. The I/O pads and traces may be made using the same techniques employed to make the bump and trace layout of FIG. 1. Another advantage of the variable bump pitch illustrated in FIG. 4 is that the core power buses 218 and the core ground buses 220 are much wider than those of FIG. 2, lowering the voltage drop and corresponding bus noise.

Other modifications, variations, and arrangements of the present invention may be made in accordance with the above teachings other than as specifically described to practice the invention within the spirit and scope defined by the following claims.

What is claimed is:

1. A method for making a bump and trace layout for an integrated circuit die comprising a step for replicating a routing tile on a flip chip integrated circuit die wherein the routing tile includes a first column of I/O pads arranged above a ground trace of the routing tile and a second column of I/O pads arranged above a ground trace of the routing tile wherein the first column of I/O pads is offset from the second column of I/O pads so that the I/O pads of the first column are interleaved between the I/O pads of the second column of I/O pads and wherein the first column of I/O pads and the second column of I/O pads are arranged substantially perpendicular to an edge of the flip chip integrated circuit die closest to a ground trace of the routing tile.

2. The method of claim 1 wherein the first column of I/O pads has only two signal I/O pads and the second column of I/O pads has only four signal I/O pads.

3. The method of claim 1 wherein the routing tile comprises only six signal I/O pads, a single power I/O pad, and a single ground I/O pad.

4. The method of claim 1 further comprising the step of routing signal traces between the first column and the second column.

5. The method of claim 1 further comprising the step of routing a power trace and a ground trace outside the first column and the second column.

6. A method for making a bump and trace layout for an integrated circuit die comprising steps for:
 replicating a routing tile having a first column of I/O pads and a second column of I/O pads wherein the first column is offset from the second column of I/O pads so that the I/O pads of the first column are interleaved between the I/O pads of the second column of I/O pads; and
 routing a core power bus from core power I/O pads to device power I/O pads wherein the core power I/O pads and the device power I/O pads have a variable bump pitch.

7. A method for making a bump and trace layout for an integrated circuit die comprising steps for:
 replicating a routing tile having a first column of I/O pads and a second column of I/O pads wherein the first column is offset from the second column of I/O pads so that the I/O pads of the first column are interleaved between the I/O pads of the second column of I/O pads; and
 routing a core ground bus from core ground I/O pads to device ground I/O pads wherein the core ground I/O pads and the device ground I/O pads have a variable bump pitch.

8. An integrated circuit die comprising a routing tile on a flip chip integrated circuit die wherein the routing tile includes a first column of I/O pads arranged above a ground trace of the routing tile and a second column of I/O pads arranged above a ground trace of the routing tile wherein the first column of I/O pads is offset from the second column of I/O pads so that the I/O pads of the first column are interleaved between the I/O pads of the second column of I/O pads and wherein the first column of I/O pads and the second column of I/O pads are arranged substantially perpendicular to an edge of the flip chip integrated circuit die closest to a ground trace of the routing tile.

9. The integrated circuit die of claim 8 wherein the first column of I/O pads has only two signal I/O pads and the second column of I/O pads has only four signal I/O pads.

10. The integrated circuit die of claim 8 wherein the routing tile comprises only six signal I/O pads, a single power I/O pad, and a single ground I/O pad.

11. The integrated circuit die of claim 8 further comprising signal traces routed between the first column and the second column.

12. The integrated circuit die of claim 8 further comprising a power trace and a ground trace routed outside the first column and the second column.

13. An integrated circuit die comprising:
 a routing tile having a first column of I/O pads and a second column of I/O pads wherein the first column is offset from the second column so that the I/O pads of the first column are interleaved between the I/O pads of the second column; and
 a core power bus routed from core power I/O pads to device power I/O pads wherein the core power I/O pads and the device power I/O pads have a variable bump pitch.

14. An integrated circuit die comprising:
 a routing tile having a first column of I/O pads and a second column of I/O pads wherein the first column is offset from the second column so that the I/O pads of the first column are interleaved between the I/O pads of the second column; and
 a core ground bus routed from core ground I/O pads to device ground I/O pads wherein the core ground I/O pads and the device ground I/O pads have a variable bump pitch.

15. A routing tile for a flip chip integrated circuit die comprising:
  a ground trace;
  a first column of I/O pads arranged above the ground trace; and
  a second column of I/O pads arranged above the ground trace wherein the first column of I/O pads is offset from the second column of I/O pads so that the I/O pads of the first column are interleaved between the I/O pads of the second column of I/O pads and wherein the first column of I/O pads and the second column of I/O pads are arranged substantially perpendicular to an edge of the flip chip integrated circuit die closest to the ground trace.

* * * * *